United States Patent [19]
Chan

[11] Patent Number: 5,838,551
[45] Date of Patent: Nov. 17, 1998

[54] ELECTRONIC PACKAGE CARRYING AN ELECTRONIC COMPONENT AND ASSEMBLY OF MOTHER BOARD AND ELECTRONIC PACKAGE

[75] Inventor: Yee-Ning Chan, Nepean, Canada

[73] Assignee: Northern Telecom Limited, Montreal, Canada

[21] Appl. No.: 691,056

[22] Filed: Aug. 1, 1996

[51] Int. Cl.⁶ .................................................. H05K 9/00
[52] U.S. Cl. .................... 361/818; 361/760; 174/35 R; 174/35 GC; 257/699; 257/723; 257/728
[58] Field of Search .................................. 361/760, 767, 361/818; 174/35 R, 35 GC, 357 S, 51; 257/659, 660, 699, 723, 728, 738, 778; 437/221; 29/832, 840

[56] References Cited

U.S. PATENT DOCUMENTS 5,355,016  10/1994  Swirbel et al. ................. 174/35 GC X
5,400,949  3/1995  Hirvonen et al. .................... 361/818 X
5,422,433  6/1995  Rivera et al. ....................... 174/35 GC
5,530,202  6/1996  Dais et al. .............................. 174/35 R

*Primary Examiner*—Leo P. Picard
*Assistant Examiner*—Jayprakash N. Gandhi
*Attorney, Agent, or Firm*—R. J. Austin

[57] ABSTRACT

Electronic package with an electronic component mounted upon a PCB or ceramic substrate by first level interconnects and housing second level interconnects on the other side of the PCB. The component is protected by an EMI shield which is grounded to a ground plane of the PCB. Especially significant when there are a plurality of components protected by the shield and when at least one of the components is an integrated circuit component (I.C.C.). The package is thus prebuilt with the EMI shield and without a separate package required for each I.C.C., and is robust in construction for shipping. The shield and ground plane provide a Faraday cage which is especially complete when the shield extends around edges of the PCB and onto its other side. The package is ready for connection to a motherboard by use of the second level interconnects and process steps to place EMI shields individually onto mother boards are avoided.

12 Claims, 2 Drawing Sheets

ELECTRONIC PACKAGE CARRYING AN ELECTRONIC COMPONENT AND ASSEMBLY OF MOTHER BOARD AND ELECTRONIC PACKAGE

BACKGROUND OF THE INVENTION

1. Field of the Invention

This invention relates to electronic packages.

2. Related Prior Art

In the manufacture of electronic circuitry assemblies, printed circuit boards containing circuitry have electronic components mounted thereon and EMI shielding is then placed around certain sensitive components towards completion of the assemblies. Almost invariably, present day assemblies include integrated circuit components (i.e. chips) which need to be packaged to form electronic packages for storage and transportation purposes before incorporation into circuitry assemblies. The packaging process is an added expense to the cost of the chip. Methods of making assemblies also require additional electromagnetic interference shields (EMI shields) to be placed around sensitive components after the components have been incorporated onto the boards and this adds to the process steps required on the boards. In addition, each shield needs to be connected around its periphery to a solder trace on the board and this is connected to a ground member normally in the form of a ground plane of the board construction. The solder trace adds to complication of board design. Thus, where (as in most electronic circuitry assemblies) integrated circuit components are used, these particular components need to be prepackaged, stored and transported to the circuitry assembly locations, assembled onto printed circuit boards, and then provided with EMI shields.

SUMMARY OF THE INVENTION

The present invention provides an electronic package which is of specific convenience in use and may simplify manufacture of electronic circuitry assemblies.

Accordingly, the invention provides an electronic package comprising: a rigid planar dielectric substrate; an electronic component mounted upon a first side of the substrate and having terminals connected to a plurality of first level terminal interconnects provided upon the first side of the board; a covering EMI shield extending over the electronic component and being electrically interconnected to a ground member of the substrate; and a plurality of second level interconnects mounted upon a second side of the substrate and electrically interconnected through the substrate to the first level interconnects.

The substrate can be, for example, a printed circuit board or a ceramic substrate.

The invention provides a package which includes its own individual EMI shield for the electronic components for assembly by the second level interconnects onto a further and larger substrate which also carries its own circuitry. The ground member preferably extends across substantially the whole area of the substrate and with this arrangement, a complete Faraday cage is provided for the electronic component, the Faraday cage comprising the ground member and the EMI shield which is electrically connected to it. Thus, in a package according to the invention, the rigid substrate of the package provides a daughter board for incorporation onto a motherboard i.e. the larger substrate.

The invention has particular advantages when the electronic component comprises an integrated circuit component which conventionally is individually packaged and provided with an EMI shield. In the inventive concept however, when an integrated circuit component is included, this does not require its own individual packaging in addition to the EMI shield. The shield provides protection of the integrated circuit component and hence procedures involved in providing shields when assembling prepackaged integrated circuit components, onto substrates are not required. The preparation of the inventive package thus simplifies the final assembly process onto a larger substrate, and insofar as circuitry is included in the substrate of the package of the invention, circuitry of the larger substrate may be simplified. The package is thus a completed unit with the integrated circuit component protected against damage during storage or transportation to its assembly location onto a larger substrate.

The electronic package may include two or more electronic components, at least one of which is an integrated circuit component, and all of these components are shielded by the EMI shield.

The EMI shield preferably comprises a single metal sheet which is formed as required into the shape of the shield. This manufacture from a single metal sheet may be by punching-out a blank from the sheet and then bending the blank as required to form the shield, care being taken to bring edges of walls of the shield into close proximity thereby avoiding any gaps which could nullify the shielding effect. Alternatively, the shield may be formed from a single metal sheet by a forming and stamping operation which provides a top and side walls to the shield with side walls extending integrally into one another. Also preferably, the shield extends around and shields edges of the substrate so as to face the second side of the substrate. It is also preferred that the shield is interconnected on the second side with the ground member. When the ground member is situated within the substrate, the shield is connected by electrical pathways extending through the substrate to the ground member, the pathways advantageously being soldered to the shield. This is conveniently done by spot soldering. Alternatively, rivets make electrical contact between the shield and the ground member. Where however the ground member is provided upon either side of the substrate, then perforations must be provided in the ground member to provide insulating clearance between the ground member and the first or second level terminal interconnects as the case may be.

The invention also provides an assembly of a mother board and an electronic package incorporating a rigid planar daughter board substrate, the package further comprising an electronic component mounted upon a first side of the daughter board and having terminals connected to a plurality of first level terminal interconnects provided upon the first side of the board, a covering EMI shield extending over the electronic component and being electrically interconnected to a ground member of the daughter board; and a plurality of second level interconnects mounted upon a second side of the daughter board and electrically interconnecting through the daughter board to the first level interconnects, the second level interconnects serving to mount the electronic package onto the mother board.

The invention further includes a method of making an electronic package comprising: mounting an electronic component upon a rigid planar dielectric substrate with terminals of the component connected to first level terminal interconnects located on a first side of the substrate; and locating an EMI shield upon the substrate so as to cover the electronic component, and electrically connecting the shield to a ground member of the substrate, the first level terminal interconnects being interconnected with second level interconnects located on a second side of the substrate.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
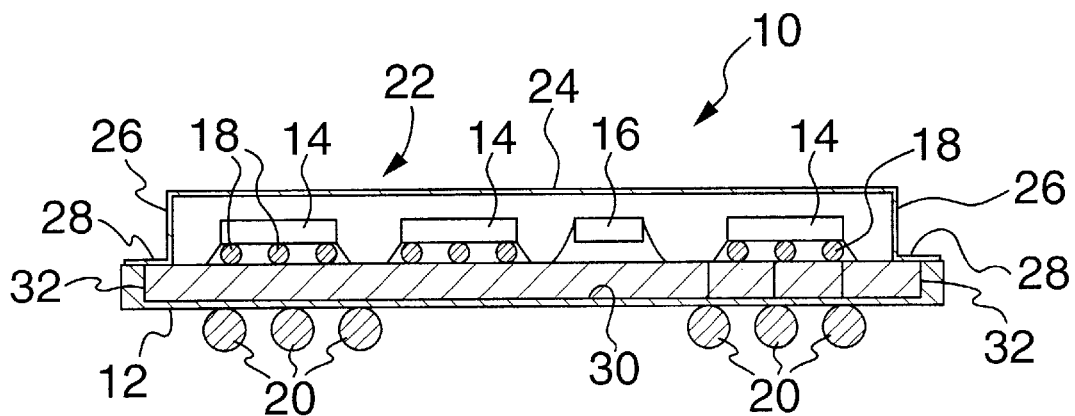
FIG. 1 is a cross-sectional view through an electronic package according to a first embodiment.

In a first embodiment as shown in FIG. 1, an electronic package 10 comprises a rigid planar dielectric substrate in the form of a printed circuit board 12. Carried upon an upper surface of the board are a plurality of electronic components comprising at least one (in this case three) integrated circuit component 14 and as shown, a capacitor or resistor 16. The electronic components are provided on the upper surface of the board with first level interconnects 18 by which the terminals of the components are connected by circuit paths in the board 12 with second level interconnects 20 on the lower surface of the board. Possibly the components 14 and 16 are also electrically interconnected together through the substrate 12. The second level interconnects 20 may be solder balls or columns as required for connection to circuitry of a mother board as will be described. The first level interconnects 18 may also be solder balls, but alternatively are bond fingers for use in conventional wire bonding techniques or for use in tape automated bonding (TAB).

Figure 2:
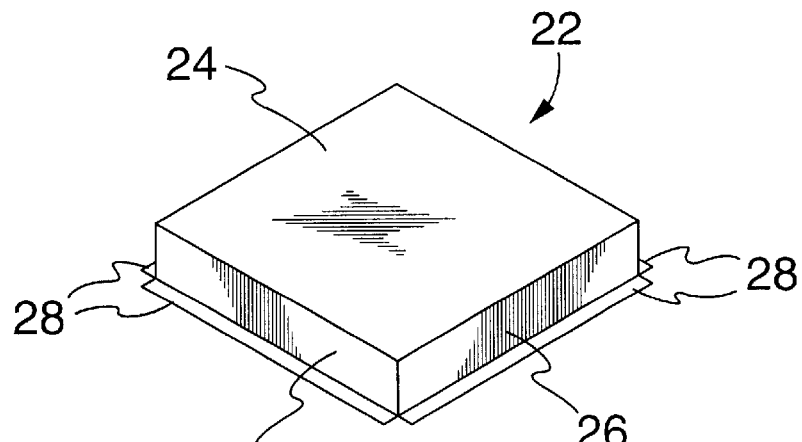
FIG. 2 is an isometric view of an EMI shield forming part of the package of FIG. 1.

The electronic components are covered on the upper side of the board by an EMI shield 22 which extends across them. The shield 22 has a closed top 24 and downwardly depending side walls 26 terminating in outwardly extending flanges 28. The structure of this shield is more clearly shown in FIG. 2. The shield may be formed from a single sheet of metal which is punched-out and then pressed into its desired shape. In this case the side walls 26 would be slightly spaced apart by the pressing operation at the vertical corners of the structure (this arrangement not being shown). In the embodiment, the structure 22 is formed by a forming and pressing operation from a flat blank sheet of metal so that all the side walls 26 interconnect at the corners with each other as well as with the top wall 24.

The shield 22 is interconnected with a ground plane 30 extending substantially throughout the printed circuit board 12, this interconnection being provided possibly by rivets but preferably by solder connections, at spaced intervals around the flanges 28, to electrical pathways 32 extending into holes around the edges of the board 12 and connecting with the ground plane.

As will be appreciated in the above structure, the second level interconnects 20 form an array of solder balls and may be referred to in common terminology of the electronic industry as "ball grid array". In addition, the shield 22 in combination with the ground plane to which it is grounded provides a Faraday cage for all electronic and electrical components and circuitry within the cage. Hence, the electronic package 10 may be said to provide a "Faraday caged ball grid array" package.

The finished electronic package is pre-manufactured for later assembly onto a mother board. This pre-manufactured package 10 comprises its own EMI shield 22 for electronic components of the package which need EMI shielding so that subsequent shielding of these components after addition to the mother board is avoided. In addition, the package provides a structure which may be handled with physical protection offered by the shield to the components during storage, and for shipping purposes before being incorporated onto the mother board. Further, with the EMI shield connected to the ground plane of the substrate 12, the pre-built structure is provided with its own Faraday cage as indicated above for protection of the electronic components beneath the shield, the Faraday cage provided on one side by the shield 22 and on the other side by the plane 30 connected to the shield by the electrical pathways 32.

Figure 3:
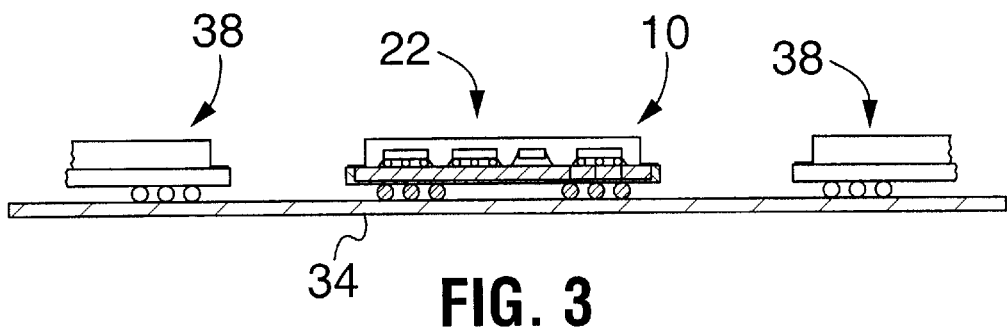
FIG. 3 is a view similar to FIG. 1 of the package mounted upon a mother board.

As shown by FIG. 3, the electronic package 10 is assembled onto a mother board 34 by the second level interconnects being connected to circuitry on the mother boards and holding the package 10 in position. The package 10, in this arrangement does, of course, provide only one of the structures carried upon the mother board which also includes other electronic components (not shown) and possibly together with other electronic packages 38 basically similar in construction to the device 10.

As may be seen therefore, and as indicated above, the assembly of the packages 10 and 38 onto the mother board 34 simplifies the final assembly process with the mother board in that the packages 10 and 36 have their Faraday cages already provided thereby eliminating the necessity for these to be added subsequently onto the mother board. This is a distinct advantage for the final manufacture of the total electronic structure.

Figure 4:
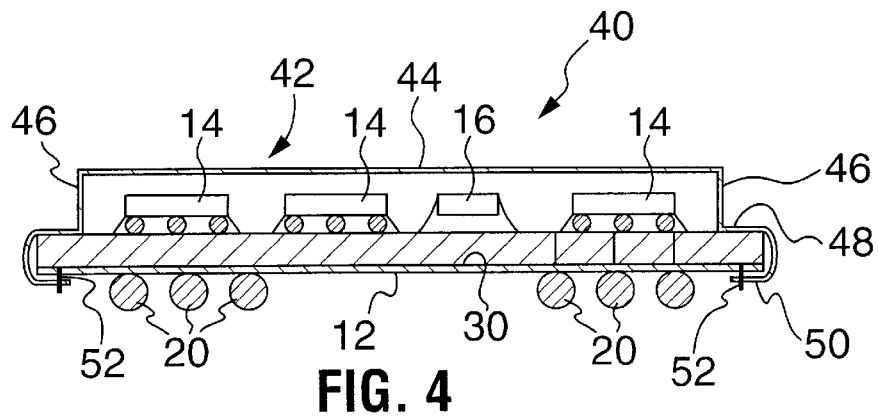
FIG. 4 is a view similar to FIG. 1 of an electronic package according to a second embodiment.
Figure 5:
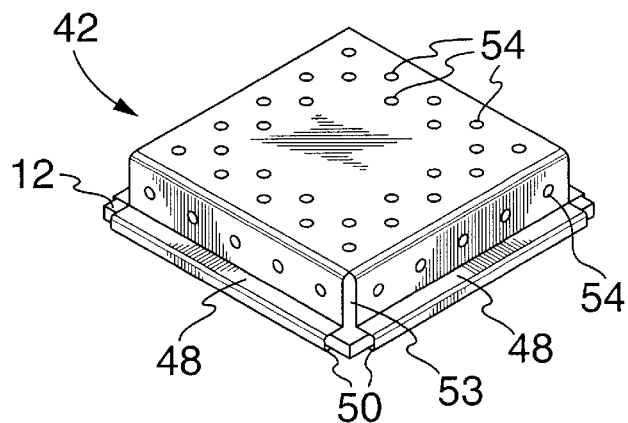
FIG. 5 is an isometric view of the package of FIG. 4.

The EMI shield need not necessarily be attached to the upper side of the board as shown in the first embodiment. For instance, as shown in a second embodiment from FIG. 4 onwards, and in which parts similar to those described in the first embodiment bear the same reference numerals, an electronic package 40 has an EMI shield 42 which is of slightly different structure from that shown in the first embodiment. As shown in the second embodiment in FIGS. 4 and 5, the shield 42 has a top wall 44 and depending side walls 46 which have outwardly extending flanges 48 similar to the flanges 28 of the first embodiment. However, in the second embodiment, the flanges 48 extend outwardly beyond edges of the board 12 and curve around the edges of the board to terminate in flange edge regions 50 which are disposed beneath and directly face the lower surface of the board. These edge regions 50 are connected to the ground plane by circuit paths 52 extending into the board. In the structure of the second embodiment, the flanges 48 extending around edges of the board 12 provide EMI protection for circuitry within the board 12 itself and the overlap between the edge regions 50 of the flanges 48 and edge regions of the ground plane 12 substantially complete a closed Faraday cage around all of the electronic components and the board circuitry. This is particularly the case where the ground plane lies towards the lower surface of the board. As shown by FIG. 5, the EMI shield 42 which is pressed, in this instance, from sheet metal has slight gaps 53 between edges of the downwardly extending walls 46. These gaps however are controlled so as to substantially eliminate any EMI leakage between the flanges. FIG. 5 also illustrates the curved portions of the flanges 48 extending around the board 12 to the undersurface of the board. The shield 42 is preferably provided, as in the first embodiment, with apertures 54 disposed in appropriate locations for air flow through the structure for removing heat from within the shield. The location of such apertures is a matter of choice with the proviso that the top surface 44 may require a large unapertured space as shown by FIG. 5 in the event that it is required to lift the package 40 by vacuum lifting techniques for assembly purposes onto a mother board.

Figure 6:
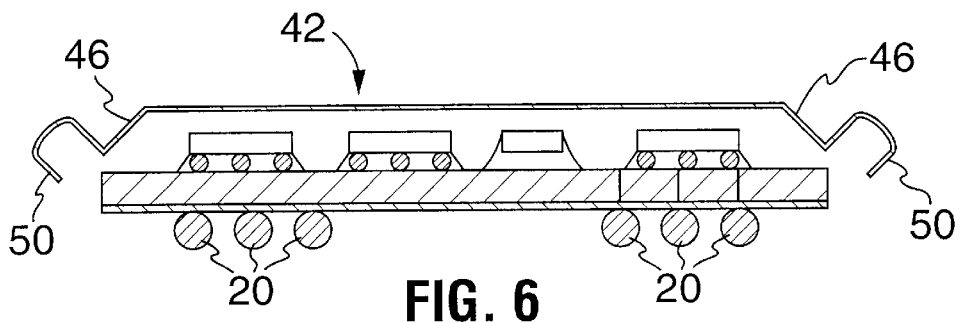
FIG. 6 is a cross-sectional view similar to FIG. 4 showing the manufacture of the package of the second embodiment during one manufacturing stage.

FIG. 6 shows part of the process of assembling the EMI shield 42 onto the board 12 in the second embodiment. The shield 42 is initially pressed from a planar sheet with opposite side walls 46 diverging outwardly from each other as they extend from the top wall 44. This provides a large space between the edge regions 50 of the flanges 46 sufficient to enable the shield to be disposed completely over the board 12 with the edge regions 50 passing down around the board towards the lower side as shown by FIG. 6. Pressure is then applied in the direction of the arrows in FIG. 6 to the side walls 46 to move opposing side walls towards each other with the result that the end regions 50 of the side walls pass beneath the printed circuit board 12 and into their final positions shown by FIG. 4. A soldering operation is then performed for connection of the edge regions 50 to the ground plane as discussed above.

Figure 7:
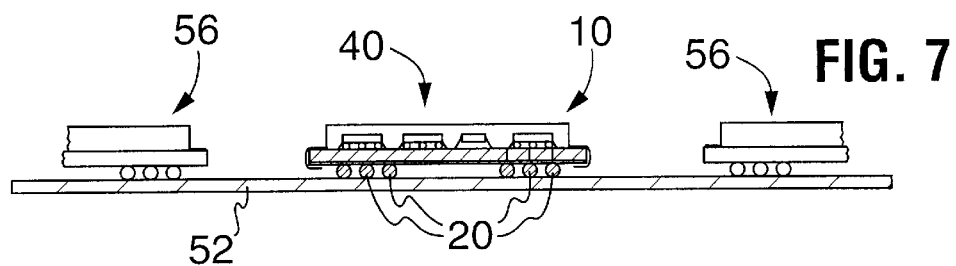
FIG. 7 is a view similar to FIG. 4 with the package of the second embodiment mounted upon a mother board.

As shown by FIG. 7, the package 40 may then be assembled onto a mother board 52 together with other electronic components (not shown) or other electronic packages 56 of similar construction to the package 40. Interconnection with the circuitry of the mother board is again performed through the second level interconnects. The advantages of the package 40 of the second embodiment and in its subsequent assembly onto the mother board are as described for the first embodiment.

What is claimed is:

1. An electronic package comprising:

a rigid planar dielectric substrate carrying a ground member extending across substantially the whole area within the confines of the edges of the substrate;

a covering EMI shield extending over the electronic component to locate the electronic component between the EMI shield and the around member of the substrate, the EMI shield being electrically interconnected to the ground member of the substrate to form with the ground member, a Faraday cage around the electronic component;

and a plurality of second level interconnects mounted upon a second side of the substrate and electrically interconnected through circuit paths in the substrate to the first level interconnects.

2. A package according to claim 1 wherein the electronic component comprises an integrated circuit component.

3. A package according to claim 1 comprising two or more electronic components mounted upon the first side of the substrate and at least one of which is an integrated circuit component and all of the components are commonly shielded by the EMI shield.

4. A package according to claim 3 wherein two or more of the electronic components are electrically interconnected by circuitry of the substrate.

5. A package according to claim 1 wherein the EMI shield comprises a single formed sheet of electrically conductive material, the sheet formed with a plurality of spaced apertures for cooling air circulation.

6. A package according to claim 1 wherein the shield is provided by a formed sheet of electrically conductive material and which extends around the shield edges of the substrate so as to face the second side of the substrate.

7. A package according to claim 6 wherein the shield is electrically interconnected with the ground member through the second side of the substrate.

8. A package according to claim 7 wherein the electrical pathways are connected to the ground member by soldering.

9. An assembly of a mother board and an electronic package incorporating a rigid planar daughter board, the package further comprising:

an electronic component mounted upon a first side of the daughter board and having terminals connected to a plurality of first level terminal interconnects provided upon the first side of the board;

a covering EMI shield extending over the electronic component and being electrically interconnected to a ground member of the daughter board;

and a plurality of second level interconnects mounted upon a second side of the daughter board and electrically interconnecting through the daughter board to the first level interconnects, the second level interconnects mounting the electronic package onto the mother board and electrically connecting the electronic component with circuitry in the mother board.

10. A method of making an electronic package comprising:

mounting an electronic component upon a rigid planar dielectric substrate with terminals of the component connected to first level terminal interconnects located on a first side of the substrate, the first level terminal interconnects being interconnected with second level interconnects located on a second side of the substrate;

and forming a Faraday cage around the electronic component by locating an EMI shield upon the substrate so as to cover the electronic component, and electrically interconnecting the shield to a ground member of the substrate, the around member extending across substantially the while area within the confines of the edges of the substrate.

11. A method according to claim 10 comprising locating the shield upon the substrate with an edge region of the shield extending outwardly beyond each edge of the substrate, moving the edge regions of the shield inwardly so that the edge regions extend around the edges of the substrate and face the second side of the substrate; and electrically interconnecting the edge regions on the second side of the substrate with the ground member.

12. A method of assembling an electronic package comprising a daughter board onto a mother board wherein the package further comprises an electronic component mounted upon a first side of and having terminals connected to a plurality of first level terminal interconnects located upon the first side of the daughter board;

a covering EMI shield extending over the electronic component and being electrically interconnected to a ground member of the daughter board;

and a plurality of second level interconnects mounted on a second side of the daughter board and electrically interconnecting through the daughter board to the first level interconnects;

the method comprising disposing the package with the second level interconnects in desired locations with respect to electrical terminals on one surface of the mother board and electrically interconnecting the second level interconnects with the electrical terminals of the mother board.

* * * * *

UNITED STATES PATENT AND TRADEMARK OFFICE
CERTIFICATE OF CORRECTION

| | | |
|---|---|---|
| PATENT NO. | : 5,838,551 | Page 1 of 1 |
| APPLICATION NO. | : 08/691056 | |
| DATED | : November 17, 1998 | |
| INVENTOR(S) | : Yee-ning Chan | |

It is certified that error appears in the above-identified patent and that said Letters Patent is hereby corrected as shown below:

Claim 1:
Column 5, between Lines 37 and 38: - insert missing claim element as follows:

--an electronic component mounted upon a first side of the substrate and having terminals connected to a plurality of first level terminal interconnects provided upon the first side of the board;--

Claim 1:
Column 5, Line 40: - change the sixth word "around" to "ground"

Claim 10:
Column 6, Line 35: - change the third word "around" to "ground"
Column 6, Line 36: - change the third word "while" to "whole"

Signed and Sealed this

Twenty-second Day of June, 2010

David J. Kappos
*Director of the United States Patent and Trademark Office*